(12) United States Patent
Beye et al.

(10) Patent No.: US 12,425,594 B2
(45) Date of Patent: Sep. 23, 2025

(54) ENCODING DEVICE, DECODING DEVICE, ENCODING METHOD, DECODING METHOD, AND PROGRAM

(71) Applicant: NEC Corporation, Tokyo (JP)

(72) Inventors: Florian Beye, Tokyo (JP); Hayato Itsumi, Tokyo (JP); Koichi Nihei, Tokyo (JP); Charvi Vitthal, Tokyo (JP); Yusuke Shinohara, Tokyo (JP); Takanori Iwai, Tokyo (JP)

(73) Assignee: NEC CORPORATION, Tokyo (JP)

( * ) Notice: Subject to any disclaimer, the term of this patent is extended or adjusted under 35 U.S.C. 154(b) by 141 days.

(21) Appl. No.: 18/266,173

(22) PCT Filed: Dec. 15, 2020

(86) PCT No.: PCT/JP2020/046638
§ 371 (c)(1),
(2) Date: Jun. 8, 2023

(87) PCT Pub. No.: WO2022/130477
PCT Pub. Date: Jun. 23, 2022

(65) Prior Publication Data
US 2024/0048703 A1 Feb. 8, 2024

(51) Int. Cl.
*H04N 19/124* (2014.01)
*H04N 19/182* (2014.01)
*H04N 19/91* (2014.01)

(52) U.S. Cl.
CPC ......... *H04N 19/124* (2014.11); *H04N 19/182* (2014.11); *H04N 19/91* (2014.11)

(58) Field of Classification Search
CPC ..... H04N 19/124; H04N 19/182; H04N 19/91
See application file for complete search history.

(56) References Cited

U.S. PATENT DOCUMENTS

| 2013/0027230 A1* | 1/2013 | Marpe ................... H04N 19/91 341/107 |
|---|---|---|
| 2014/0191888 A1 | 7/2014 | Klejsa et al. |

FOREIGN PATENT DOCUMENTS

| JP | 2001-053618 A | 2/2001 |
|---|---|---|
| JP | 2003-339047 A | 11/2003 |
| JP | 2009-194610 A | 8/2009 |
| JP | 2010-505354 A | 2/2010 |

(Continued)

OTHER PUBLICATIONS

International Search Report for PCT Application No. PCT/JP2020/046638, mailed on Mar. 23, 2021.

(Continued)

*Primary Examiner* — On S Mung

(57) ABSTRACT

Estimating determines, on the basis of processed quantized values, a quantization interval for quantizing input element values, which are elements of input values serving as a processing object and determines, on the basis of the processed quantized values, a probability distribution of quantization value candidates, which are candidates of quantized values of the input element values; quantizing uses the quantization interval to quantize the input element values and determine a quantized value; and entropy encoding uses the probability distribution to perform entropy encoding of a quantization time sequence which includes quantized value codes indicating the quantized values of the input element values.

13 Claims, 10 Drawing Sheets

(56) References Cited

FOREIGN PATENT DOCUMENTS

| | | |
|---|---|---|
| JP | 2014-502827 A | 2/2014 |
| JP | 2015-111787 A | 6/2015 |
| JP | 2017-127034 A | 7/2017 |
| WO | 2020/044135 A1 | 3/2020 |

OTHER PUBLICATIONS

Jorma Rissanen and Glen G Langdon. "Arithmetic coding". IBM Journal of research and development, 23 (2):149-162, 1979.
Glen G Langdon, Jr.. "An introduction to arithmetic coding". IBM Journal of research and development, 1984.
Jun Han, et al. "Deep Generative Video Compression". 33rd Conference on Neural Information Processing Systems (NeurIPS 2019), Vancouver, Canada, 2019.
JP Office Action for JP Application No. 2024-110556, mailed on Jun. 24, 2025 with English Translation.

* cited by examiner

ENCODING DEVICE, DECODING DEVICE, ENCODING METHOD, DECODING METHOD, AND PROGRAM

This application is a National Stage Entry of PCT/JP2020/046638 filed on Dec. 15, 2020, the contents of all of which are incorporated herein by reference, in their entirety.

TECHNICAL FIELD

The present invention relates to an encoding device, a decoding device, an encoding method, a decoding method, and a program.

BACKGROUND ART

Patent Document 1 discloses an image compression device that enables the user of an image to specify a region of interest in an image, set a different quantization rate for the region of interest than for other regions, and control compression based on the set quantization rate, and a compression/decompression device corresponding to the image compression device. The compression/decompression device includes an image segmenting means for segmenting an image into a plurality of regions, a quantization rate setting means for specifying one or more regions of attention in the image, and a compression control means for controlling the compression for each region based on the set quantization rate. The image is segmented into multiple regions by the image segmenting means, the region of interest in the image is designated by a region designation means, and when the quantization rate is set for each segmented region by quantization rate setting means, a different quantization rate is set for the designated region of interest than for other regions, with compression control being executed for each region on the basis of the set quantization rate. In other words, the image compression device transmits the quantization rate determined for each region to the compression/decompression device together with the code obtained by compressing the image with that quantization rate. The quantization rate is indicated using the quantization interval. A QP value may be used as an index value of the quantization interval.

PRIOR ART DOCUMENTS

Patent Documents

Patent Document 1: Japanese Unexamined Patent Application, First Publication No. 2003-339047

SUMMARY OF THE INVENTION

Problems to be Solved by the Invention

However, the more significant the variation in quantization intervals per region in a single frame of an image, the more information about the quantization intervals that is transmitted along with the code obtained by compression. If the quantization interval varies significantly from region to region, the amount of information in the quantization interval may reach a level that affects the total data amount of the image. For example, the more detailed the area of interest is set, the more the quantization interval tends to fluctuate significantly. Therefore, the total amount of data may exceed the transmission capacity and a transmission delay may occur. This can result in a deterioration of the quality of the decompressed image. A similar phenomenon can occur not only in the transmission of images, but also in the transmission of other types of information, such as waves like sound, and waveforms of electrical signals.

An object of the present invention is to provide an encoding device, a decoding device, an encoding method, a decoding method, and a program that solve the above problems.

Means for Solving the Problem

According to a first example aspect of the present invention, an encoding device is provided with an estimation unit that determines, on the basis of processed quantized values, a quantization interval for quantizing input element values, which are elements of input values serving as a processing object, and determines, on the basis of the processed quantized values, a probability distribution of quantization value candidates, which are candidates of quantized values for the input element values; a quantization unit that uses the quantization interval to quantize the input element values and determine a quantized value; and an entropy encoding unit that uses the probability distribution to perform entropy encoding of a quantization sequence that includes a quantized value code indicating the quantized values of the input element values.

According to a second example aspect of the present invention, a decoding device is provided with an estimation unit that determines, on the basis of processed quantized values, a quantization interval for determining a quantized value by de-quantizing a quantized value code to be processed and determines a probability distribution of quantization value candidates, which are candidates of the quantized values, on the basis of the processed quantized values; an entropy decoding unit that uses the probability distribution to entropy-decode a coding sequence to generate a quantized value sequence that includes the quantized value code; and an inverse quantization unit that de-quantizes the quantized value code included in the quantized value sequence to determine the quantized value.

According to a third example aspect of the present invention, an encoding method in an encoding device has an estimation process that determines, on the basis of processed quantized values, a quantization interval for quantizing input element values, which are elements of input values serving as a processing object, and determines, on the basis of the processed quantized values, a probability distribution of quantization value candidates, which are candidates of quantized values for the input element values; a quantization process that uses the quantization interval to quantize the input element values and determine a quantized value; and an entropy encoding process that uses the probability distribution to perform entropy encoding of a quantization sequence that includes a quantized value code indicating the quantized values of the input element values.

According to a fourth example aspect of the present invention, a decoding method in a decoding device has an estimation process that determines, on the basis of processed quantized values, a quantization interval for determining a quantized value by de-quantizing a quantized value code to be processed and determines a probability distribution of quantization value candidates, which are candidates of the quantized values, on the basis of the processed quantized values; an entropy decoding process that uses the probability distribution to entropy-decode a coding sequence to generate a quantized value sequence that includes the quantized value code; and an inverse quantization process that de-quantizes the quantized value code included in the quantized value sequence to determine the quantized value.

Effect of Invention

According to the present invention, it is possible to estimate a quantization interval without information on the quantization interval being provided in decoding a coding sequence obtained by encoding. Therefore, it is possible to avoid an increase in the amount of information due to the provision of information on the quantization interval.

EXAMPLE EMBODIMENT

Hereinbelow, example embodiments of the present invention will be described below with reference to the drawings.

First Example Embodiment

Figure 1:
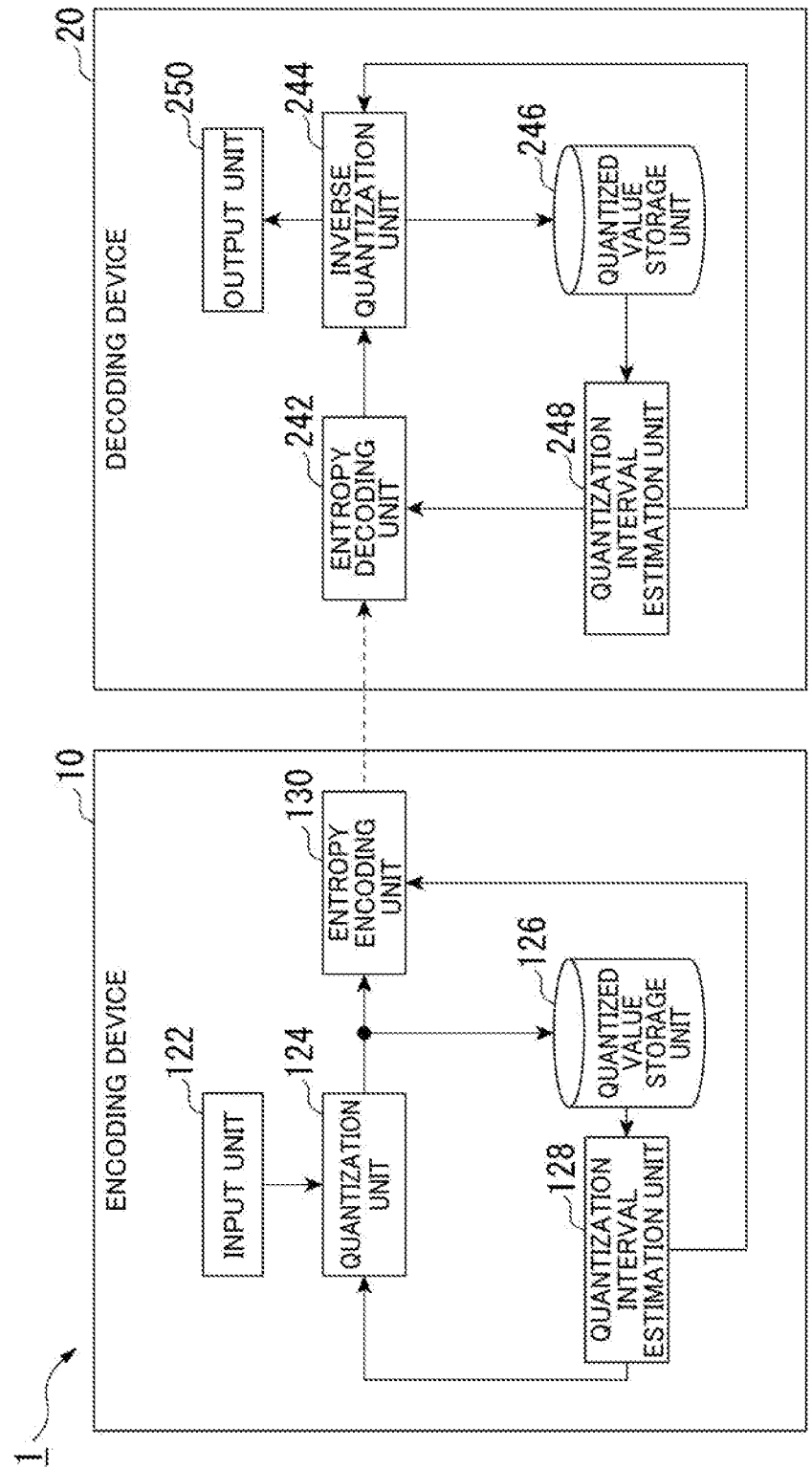
FIG. 1 is a schematic block diagram showing a configuration example of a data processing system according to the first example embodiment.

First, the first example embodiment will be described. FIG. 1 is a schematic block diagram showing a configuration example of a data processing system 1 according to the first example embodiment. The data processing system 1 includes an encoding device 10 and a decoding device 20. In the following description, it is mainly assumed that the encoding device 10 and the decoding device 20 are configured as an image encoding device and an image decoding device, respectively. The input value to be processed by the encoding device 10 and the output value that the decoding device 20 takes as the result of the decoding process may each be a signal value for each pixel, or may be a feature quantity indicating the feature of the image, or an element value of that feature quantity. The encoding device 10 and the decoding device 20 may each be included in a part of another device. Other devices are not limited to general-purpose information devices such as PCs (personal computers), tablet terminals, multi-function mobile phones, and content servers, but may also be dedicated devices such as cameras, recorders, and players.

The encoding device 10 determines, on the basis of processed quantized values, a quantization interval for quantizing input element values, which are elements of input values serving as a processing object, and determines, on the basis of the processed quantized values, a probability distribution of quantization value candidates, which are candidates of quantized values of the input element values. The encoding device 10 determines a quantized value by quantizing the input element values using the determined quantization interval. The encoding device 10 entropy-encodes a quantized sequence including a quantized value code indicating a quantized value of an input element value using the determined probability distribution. The encoding device 10 outputs the coding sequence generated by the entropy encoding to the decoding device 20.

The decoding device 20 receives the coding sequence as input by the encoding device 10. The decoding device 20 determines, on the basis of the processed quantized values, a quantization interval for determining a quantized value by de-quantizing a quantized value code to be processed, and determines, on the basis of the processed quantized values, a probability distribution of quantization value candidates, which are candidates of quantized values. The decoding device 20 entropy-decodes the coding sequence using the determined probability distribution to generate a quantized value sequence including the quantized value code to be processed. The decoding device 20 de-quantizes the quantized value code included in the quantized value sequence to determine the quantized value.

Next, a functional configuration example of the encoding device 10 will be described.

The encoding device 10 is provided with an input unit 122, a quantization unit 124, a quantized value storage unit 126, a quantization interval estimation unit 128, and an entropy encoding unit 130.

An input value to be processed is input to the input unit 122. An input value input at one time may be one element value, or may include two or more element values. In the present application, element values included in the input value are called "input element values".

The input unit 122 sequentially outputs input element values input to itself to the quantization unit 124.

The quantization unit 124 receives the input element values from the input unit 122, with quantization intervals being input from the quantization interval estimation unit 128. The quantization unit 124 quantizes the input element value $z_i$ that is input according to the quantization interval $Q_i$ that is input, determines the quantized value $Z_i$ of the input element value, and determines a code indicating the quantized value (hereinbelow, "quantized value code"). The input element value $z_i$ is a value to be subject to the encoding process, among the input sequence $z_i, z_j$, which are the input values. i and the like indicate an index for identifying an individual input element value.

The quantization interval for one input element value is given, for example, by one predetermined value (scalar) for the entire value range. In that case, the quantized value for the input element value is the value that most closely approximates the input element value among several discrete values that are equally discretized in that quantization interval between the minimum and maximum values of the value. A quantization interval for one input element value may be given by one predetermined value for each of a plurality of sections obtained by dividing the value range. In that case, the quantization interval is a vector containing one sectional-specific interval for each section as an element value.

Each individual section may consist of one quantization interval, or may include two or more quantization intervals. The quantized value for an input element value included in a section containing two or more quantization intervals is the discrete value that most closely approximates its input element value among a plurality of discrete values that divide the section into two or more quantization intervals. These discrete values are therefore candidates of quantized values. In the following discussion, candidates of quantized values are sometimes referred to as "quantization value candidates." The quantized value code is a code corresponding to the quantized value that has been determined, among the codes corresponding to each of the plurality of quantization value candidates.

The code corresponding to each of the plurality of quantization value candidates may be, for example, a number determined in ascending order from the minimum value, or a bit string indicating the number. For example, the quantized value code 1 obtained using a quantization interval 1 for a given quantized value 1, and the quantized value code 2 obtained using the quantization interval 2 different from the quantization interval 1 for another quantized value 2 different from the quantized value 1 may be equal or different. In the following description, the code for each of a plurality of quantization value candidates may be called a "quantization value candidate code".

The quantization unit 124 stores the determined quantized value in the quantized value storage unit 126 and outputs the quantized value code indicating the quantized value to the entropy encoding unit 130.

The quantized value $Z_i$ determined by the quantization unit 124 is sequentially stored in the quantized value storage unit 126. The quantized values stored in the quantized value storage unit 126 correspond to the quantized value codes encoded by the entropy encoding unit 130. When a new quantized value $Z_i$ is stored, the quantized values $Z_i, \ldots Z_{i-1}$ corresponding to prior processed input element values come to be stored in the quantized value storage unit 126.

The quantization interval estimation unit 128 uses a predetermined mathematical model to estimate the quantization interval for the input element value to be processed based on the quantized value of the processed input element value stored in the quantized value storage unit 126, and determines the probability distribution of the quantization value candidates for that input element value. In this example embodiment, there are a plurality values that are candidates of the quantization interval (hereinbelow referred to as "quantization interval candidate values"). Each of the plurality of quantization interval candidate values is a real number or an integer. A plurality of quantization interval candidate values may be set in advance in the quantization interval estimation unit 128.

The quantization interval estimation unit 128 may reset the process for determining the probability distribution of the quantization value candidates for each unit that executes the encoding process at one time in the entropy encoding (hereinbelow referred to as "entropy encoding units"). An entropy encoding unit is a sequence including N quantized value codes (N is a predetermined integer equal to or greater than 2). The entropy encoding unit corresponds to an entropy decoding unit (described later) in the decoding device 20. The probability distribution of the quantization value candidates, which are candidates for the quantized value $Z_i$ for the input element value to be processed, is a conditional probability distribution of the quantization value candidates under the quantized values $Z_i, \ldots, Z_{i-1}$ for the processed input element values. The probability distribution of quantization value candidates can also be regarded as prediction values predicted from quantized values $Z_i, \ldots, Z_{i-1}$ for processed input element values. In this example embodiment, the probability distribution of quantization value candidates is a discrete probability distribution indicating the occurrence probability of each quantization value candidate. The quantized value corresponds to one of those quantization value candidates. The quantization interval estimation unit 128 determines a preset initial value $P_1$ as the probability distribution of the quantization value candidates for the quantized value $Z_i$ immediately after resetting for each entropy encoding unit. For example, a uniform distribution may be applied as the initial value $P_1$. In a uniform distribution, the occurrence probabilities of the quantization value candidates are equal to each other.

Mathematical models applied to the quantization interval estimation unit 128 include a mathematical model for determining the quantization interval (hereinbelow referred to as a "quantization interval model") and a mathematical model for determining the probability distribution of candidates of quantized values (hereinbelow referred to as a "probability distribution model"). The quantization interval estimation unit 128 reads, for example, the quantized values $Z_{i-1-M}, \ldots, Z_{i-1}$ for the latest predetermined number (e.g., M up to i−1, where M is a given integer greater than or equal to 1) of processed input element values from the quantized value storage unit 126 as explanatory variables for the quantization interval model, and calculates the occurrence probability of each quantization interval candidate value for the input element value $z_i$ at that time as an objective variable. The quantization interval estimation unit 128 can determine the quantization interval candidate value that gives the highest occurrence probability as the quantization interval $Q_i$ for the input element value $z_i$. The quantization interval estimation unit 128 can also be regarded as predicting the quantization interval $Q_i$ for the input element value $z_i$ to be processed from the quantized values $Z_{i-1-M}, \ldots, Z_{i-1}$ for the processed input element values.

The quantization interval estimation unit 128 adopts, for example, the quantized values $Z_{i-1-M}, \ldots, Z_{i-1}$ read as explanatory variables of the probability distribution, and calculates the occurrence probability of each quantization interval candidate value of the quantized value $Z_i$ for the input element value $z_i$ at that time as the probability distribution $P(\{Z_i\} | Z_{i-1-M}, Z_{i-1})$ of the quantization value candidates, which are the candidates of the quantized value $Z_i$. $\{Z_i\}$ indicates a set of quantization value candidates for the quantized value $Z_i$. The calculated probability distribution is the conditional probability distribution of the quantized value $Z_i$, given M processed quantized values $Z_{i-1-M}$. The probability distribution $P(\{Z_i\}|Z_{i-1-N}, \ldots, Z_{i-1})$ may be represented by the occurrence probability for each quantization value candidate, or represented by the occurrence probability of each quantization value candidate code corresponding to each quantization value candidate.

As mathematical models, for example, neural networks such as recurrent neural networks (RNN), convolutional neural networks (CNN), and other neural networks can be applied. Applicable mathematical models are not limited to neural networks, but may be other types of machine learning models such as Random Forest (RF) and Support Vector Machine (SVM).

The quantization interval estimation unit 128 outputs the quantization interval $Q_i$ determined for the input element value $z_i$ at that point to the quantization unit 124, and outputs the probability distribution $P(\{Z_i\}|Z_{i-1-M}, Z_{i-1})$ of the quantization value candidates to the entropy encoding unit 130.

The entropy encoding unit 130 receives the quantized value code corresponding to the quantized value $Z_i$ determined by the quantization unit 124, and the probability distribution $P(\{Z_i\}|Z_{i-1-N}, \ldots, Z_{i-1})$ of the quantization value candidates determined by the quantization interval estimation unit 128. The entropy encoding unit 130 executes entropy encoding for each entropy encoding unit forming a quantization sequence including a plurality of quantized value codes to generate a coding sequence. Entropy encoding is a type of reversible coding (sometimes called lossless compression). As described below, entropy decoding, which is inverse processing of entropy encoding, can be executed on the generated coding sequence to recover the original quantized sequence.

Figure 4:
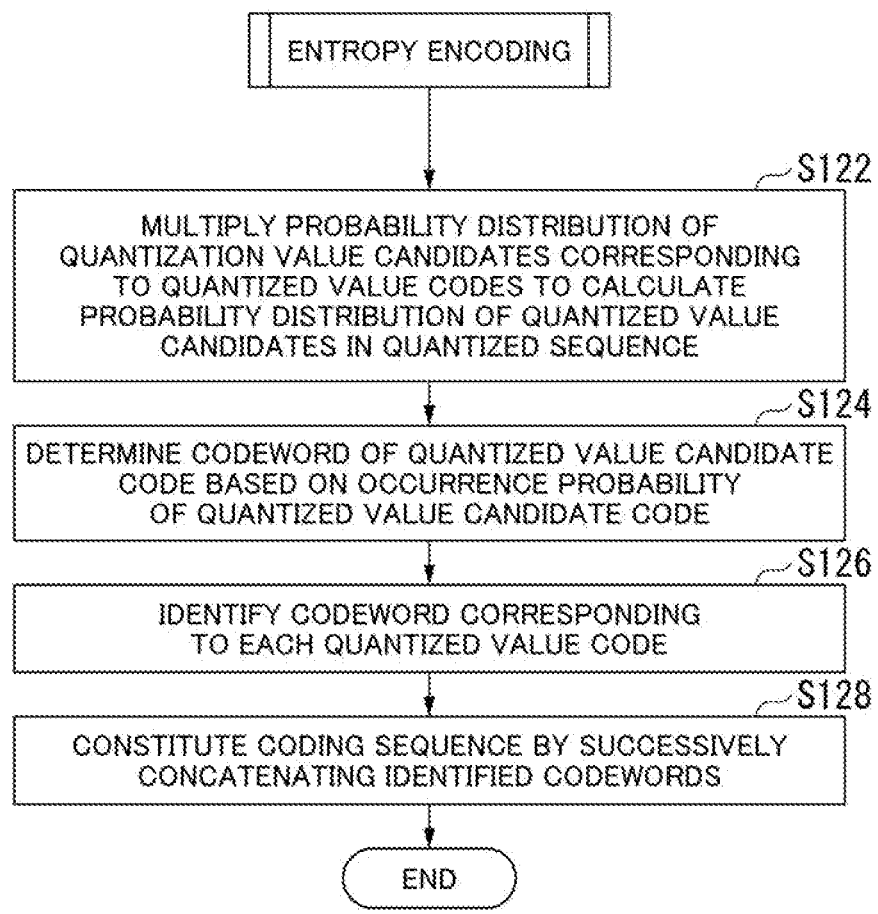
FIG. 4 is a flowchart illustrating an example of the entropy encoding process according to the first example embodiment.

More specifically, the entropy encoding unit can determine the coding sequence by executing the processing illustrated in FIG. 4.

(Step S122) The entropy encoding unit 130 sequentially multiplies the probability distribution $P(Z_i|Z_{i-1-N}, \ldots, Z_{i-1})$ of the quantization value candidates corresponding to the individual quantized value codes in the entropy encoding unit, and calculates the products as a probability distribution of quantized value candidates given for the entirety of the input coding sequence. The calculated probability distribution indicates the occurrence probability for each quantization value candidate code indicating each quantized value candidate.

(Step S124) A plurality of codewords are set in the entropy encoding unit 130 in advance. A codeword is, for example, a bit sequence composed of one or more bits. The bit strings forming each of the plurality of codewords are different from each other. The entropy encoding unit 130 determines, for each quantization value candidate code, a codeword having a larger amount of information (bit length) for a quantization value candidate code that gives a lower occurrence probability, and stores a codeword set that associates an individual quantization value candidate code with a codeword. The entropy encoding unit 130 can use any method such as Huffman coding or arithmetic coding in the coding of the quantization value candidate code.

(Step S126) The entropy encoding unit 130, referring to the stored codeword set, identifies the codeword corresponding to the quantization value candidate code equal to the quantized value code corresponding to the quantized value $Z_i$ that was input.

(Step S128) The entropy encoding unit 130 generates a coding sequence by concatenating the codewords identified for the individual quantized value codes in the order in which the quantized value codes are input. The entropy encoding unit 130 outputs the generated coding sequence to the decoding device 20.

Next, a functional configuration example of the decoding device 20 (FIG. 1) will be described.

The decoding device 20 includes an entropy decoding unit 242, an inverse quantization unit 244, a quantized value storage unit 246, a quantization interval estimation unit 248, and an output unit 250.

In the entropy decoding unit 242, a coding sequence from the encoding device 10 is input for each entropy decoding unit, and the probability distribution $P(\{Z_i\}|Z_{i-1-M}, \ldots, Z_{i-1})$ of the quantization value candidates is input from the quantization interval estimation unit 248 for each decoded quantized value. The entropy decoding unit 242 executes entropy decoding on the coding sequence input from encoding device 10 (hereinbelow referred to as the "input coding sequence") to generate a quantized sequence including N quantized value codes, and outputs the generated quantized value codes are individually output to the inverse quantization unit 244 according to the order.

As will be described later, the probability distribution $P(\{Z_i\}|Z_{i-1-M}, \ldots, Z_{i-1})$ input from the quantization interval estimation unit 248 corresponds to the probability distribution $P(\{Z_i\}|Z_{i-1-M}, Z_{i-1})$ of the quantization value candidates for the quantized value $Z_i$ based on the quantized value code output to the inverse quantization unit 244. The entropy decoding unit 242 can decode quantized value codes, including quantized value codes that indicate individual quantized values $Z_i$, by recursively determining a reconstructed sequence that is equal to the input coding sequence. A reconstructed sequence refers to a coding sequence reconstructed using the probability distribution $P(\{Z_i\}|Z_{i-1-M}, \ldots, Z_{i-1})$ of quantization value candidates for individual quantized values $Z_i$.

Figure 5:
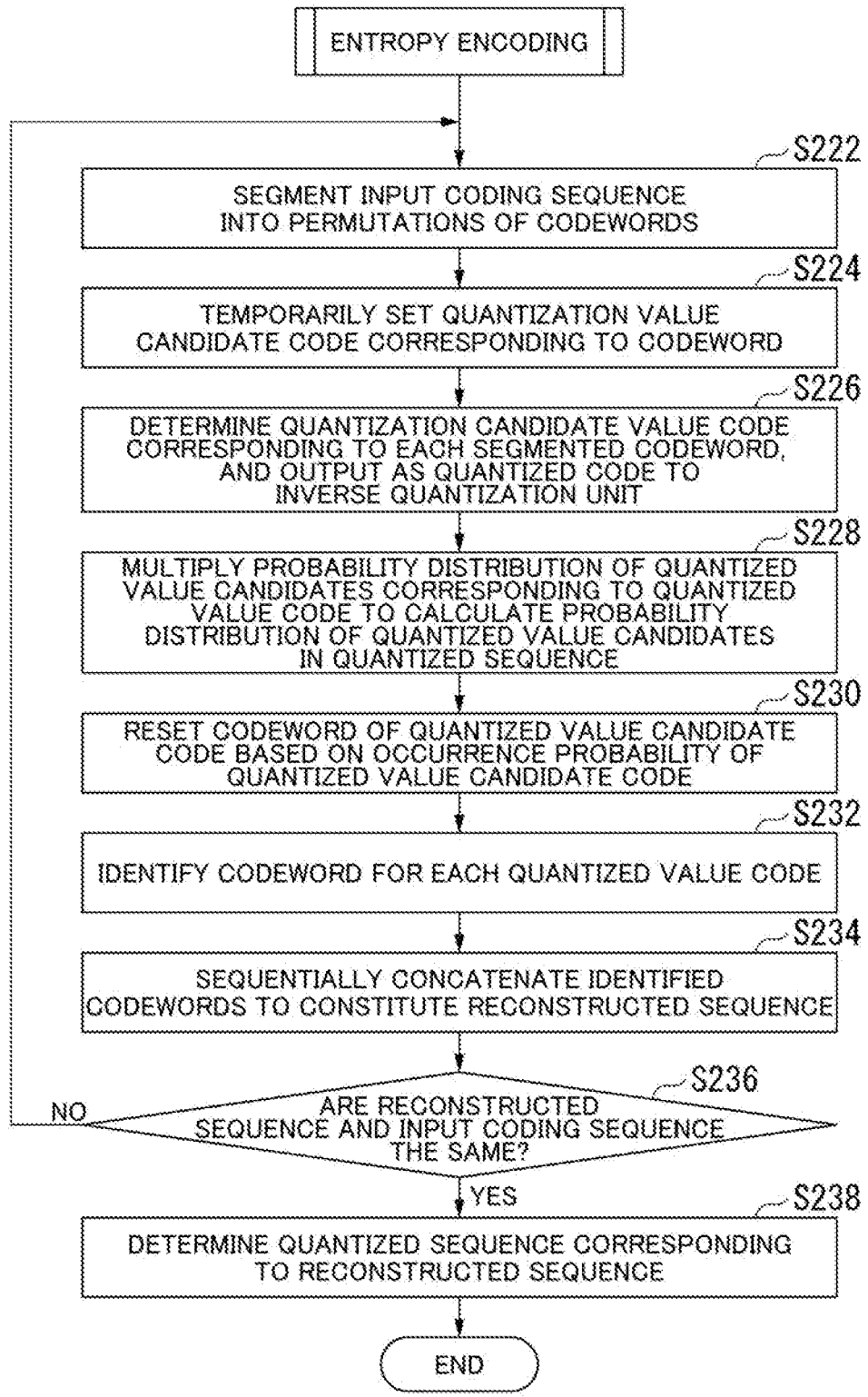
FIG. 5 is a flowchart showing an example of the entropy decoding process according to the first example embodiment.

More specifically, the entropy decoding unit 242 can determine the quantization sequence by executing the process illustrated in FIG. 5. Like the entropy encoding unit 130, the entropy decoding unit 242 is preset with a plurality of codewords and a plurality of quantization value candidate codes. Here, the entropy decoding unit 242 uses, as the entropy decoding method, a method corresponding to the inverse process of the entropy encoding method used by the entropy encoding unit 130.

(Step S222) The entropy decoding unit 242 segments the input coding sequence into permutations of N codewords. In segmenting the codewords into permutations, the entropy decoding unit 242 sequentially identifies codewords having bit strings that match bit strings that are part of the input coding sequence in the segmentation of the input coding sequence. In general, there are multiple permutations of N codewords included in an input coding sequence. Also, some of the preset codewords may not be included in the segmented permutations, or other portions may be included more than once.

(Step S224) The entropy decoding unit 242 temporarily determines the quantization value candidate code corresponding to each codeword, and stores a set of codewords that correspond to the individual codewords and the corresponding one temporarily determined quantization value candidate code.

(Step S226) The entropy decoding unit 242 refers to the stored codeword set, determines the quantization value candidate code corresponding to each segmented codeword, and sequentially outputs the quantization value candidate code corresponding to the codeword as a quantized value code to the inverse quantization unit 244 according to the order of placement in the input coding sequence.

(Step S228) The entropy decoding unit 242 sequentially multiplies the probability distribution $P(Z_i|Z_{i-1-N}, \ldots, Z_{i-1})$ of the quantized value candidates corresponding to the individual quantized value codes, and calculates the products as a probability distribution of quantized value candidates given for the entirety of the quantized sequence.

(Step S230) The entropy decoding unit 242 resets, for each quantization value candidate code, a codeword having a larger amount of information for a quantization value candidate code that gives a lower occurrence probability, and updates the coding set for the original quantization value candidate code to a codeword set obtained by coordinating that quantization value candidate code and the corresponding reset codeword.

(Step S232) The entropy decoding unit 242 refers to the stored codeword set to identify a quantization value candidate code equal to the quantized value code that gives the quantized value corresponding to each of the input probability distributions $P(Z_i|Z_{i-1-N}, \ldots, Z_{i-1})$ and identifies the codeword corresponding to the identified quantization value candidate code.

(Step S234) The entropy decoding unit 242 concatenates the codewords identified for the individual quantized value codes constituting the input coding sequence in the specified order to generate the coding sequence as the reconstructed sequence.

(Step S236) The entropy decoding unit 242 determines whether or not the reconstructed sequence that has been generated and the input coding sequence are the same. When it is determined that they are equal (Step S236 YES), the process proceeds to Step S238, and when it is determined that they are not equal (Step S236 NO), the process returns to Step S222, and the entropy decoding unit 242 repeats the process from Step S222 onward up to this step. However, the entropy decoding unit 242 executes one or both of (1) and (2) in the repeated processing. Therefore, a different reconstructed sequence is generated, and the generated reconstructed sequence and the input coding sequence are collated.

(1) In Step S222, the pattern for segmenting N codewords into permutations is changed to a new segmentation pattern that has not been used in the already-executed process.

(2) In Step S224, the correspondence between the codeword and the quantization value candidate code is changed to a new correspondence that has not been used in the already-executed process.

(Step S238) The entropy decoding unit 242 determines the permutation of the quantized value code corresponding to each of the N codewords forming the reconstructed sequence as the quantized sequence resulting from entropy decoding. The entropy decoding unit 242 outputs the determined quantized sequence to the inverse quantization unit 244. Subsequently, the processing of FIG. 5 ends.

Note that for each quantized value code included in the quantized sequence input from the entropy decoding unit 242, the inverse quantization unit 244 executes inverse quantization using the quantization interval for the quantized value code, and calculates the quantized value $Z_i$. The inverse quantization unit 244 outputs the calculated quantized value $Z_i$ to the output unit 250.

The output unit 250 holds the quantized value $Z_i$ input from the inverse quantization unit 244 as an output element value that is an element of the output value. The output unit 250 outputs an output value including the output element value to the outside of the decoding device 20 or another member.

Individual quantized value codes are sequentially input from the entropy decoding unit 242, and the quantization interval $Q_i$ for the quantized value $Z_i$ pertaining to that quantized value code is sequentially input to the inverse quantization unit 244. The quantized value code input at this stage is the quantized value code input from the entropy decoding unit 242 input at Step S226. The inverse quantization unit 244 de-quantizes each quantized value code using the corresponding quantization interval $Q_i$ to calculate the quantized value $Z_i$. The inverse quantization unit 244 stores the determined quantized value in the quantized value storage unit 246.

The processing executed by the quantized value storage unit 246 and the quantization interval estimation unit 248 are the same as the processing executed by the quantized value storage unit 126 and the quantization interval estimation unit 128, respectively.

That is, the quantized value $Z_i$ determined by the inverse quantization unit 244 is sequentially stored in the quantized value storage unit 246. The quantized value stored in the quantized value storage unit 246 corresponds to the quantized value code determined by the entropy decoding unit 242. At the time the quantized value $Z_i$ is newly stored, the quantized values $Z_i, \ldots, Z_{i-1}$ determined earlier are stored in the quantized value storage unit 246.

The quantization interval estimation unit 248 uses the quantization interval model and probability distribution model to respectively determine the quantization interval $Q_i$ for the quantized value $Z_i$ and the probability distribution $P(\{Z_i\}|Z_{i-1-N}, \ldots, Z_{i-1})$ of the quantization value candidate for that quantized value $Z_i$ based on the processed quantized values stored in the quantized value storage unit 246. The quantization interval estimation unit 248 outputs the determined quantization interval $Q_i$ to the inverse quantization unit 244, and outputs the probability distribution $P(\{Z_i\}|Z_{i-1-N}, Z_{i-1})$ of the quantization value candidates to the entropy decoding unit 242.

The entropy encoding unit 130 and the entropy decoding unit 242 can use, for example, the arithmetic coding and corresponding decoding methods described in the following literature as methods for determining the codewords corresponding to quantized value codes that represent individual quantized values, respectively.

Jorma Rissanen and Glen G. Langdon. Arithmetic coding. IBM Journal of Research and Development, 23 (2):149-162, 1979.

Glen G. Langdon. An introduction to arithmetic coding. IBM Journal of Research and Development, 1984.

Jun Han, et al. Deep Generative Video Compression. 33rd Conference on Neural Information Processing Systems (NeurIPS 2019), Vancouver, Canada, 2019.

(Hardware Configuration Example)

Each part of the encoding device 10 may be configured including dedicated members, or may be configured including general-purpose members described below and function as a computer.

Figure 2:
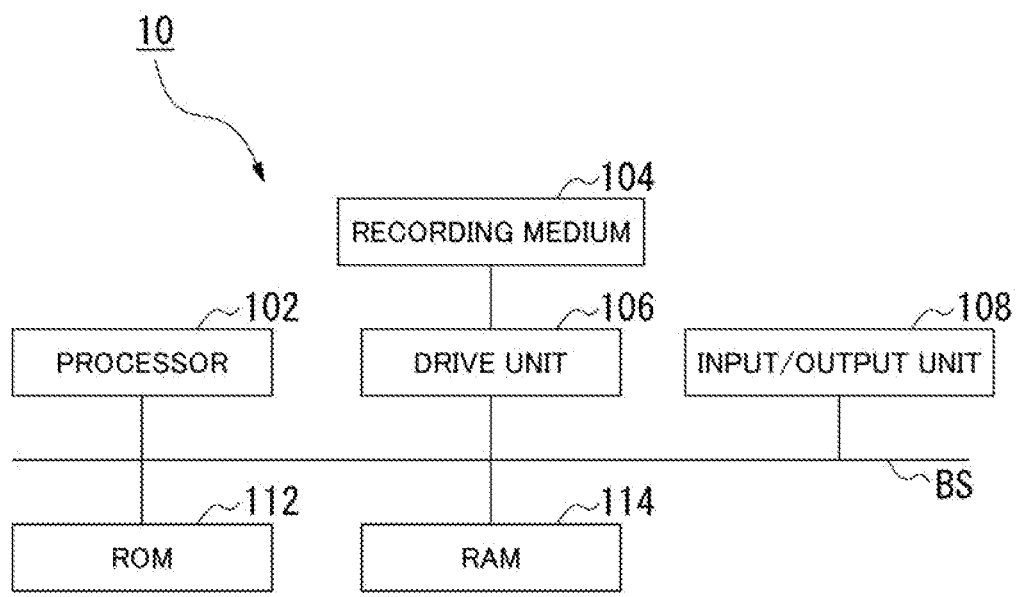
FIG. 2 is a schematic block diagram showing a hardware configuration example of the encoding device according to the first example embodiment.

FIG. 2 is a schematic block diagram showing a hardware configuration example of the encoding device 10 according to this example embodiment.

The encoding device 10 includes a processor 102, a drive unit 106, an input/output unit 108, a ROM 112, and a RAM 114.

The processor 102 controls processing for making the functions of the encoding device 10 available and the functions of the units that make up the encoding device 10. The processor 102 is, for example, a CPU (Central Processing Unit).

The drive unit 106 has a detachable storage medium 104 and reads various data stored in the storage medium 104 or stores various data in the storage medium 104. The drive unit 106 is, for example, a semiconductor drive (SSD: solid state drive). The storage medium 104 is, for example, non-volatile memory such as RAM (Random Access Memory) or flash memory.

The input/output unit 108 inputs or outputs various data to/from other devices in a wireless or wired manner. The input/output unit 108 may be connected to other devices via a communication network so that various data can be input/output. The input/output unit 108 may be, for example, an input/output interface, a communication interface, or a combination thereof.

A ROM (Read Only Memory) 112 permanently stores various data such as programs containing instructions for various processes to be executed by the various parts of the encoding device 10, parameters for their execution, and various data acquired by the various parts of the encoding device 10. In the following description, executing a process instructed by an instruction written in a program may be referred to as "executing the program", "execution of the program", or the like.

The RAM 114 is mainly used as a work area for the CPU 110. The CPU 10 records a program and parameters stored in the ROM 112 in the RAM 114 upon activation. Then, the CPU 110 temporarily records in the RAM 114 the calculation results obtained by the execution, the obtained data, and the like.

Note that each unit of the decoding device 20 may also be configured including dedicated members, or may be configured including the hardware configuration illustrated in FIG. 2.

(Example of Machine Learning Model)

Next, examples of machine learning models used in the quantization interval estimation units 128 and 248 according to this example embodiment will be described.

Figure 3:
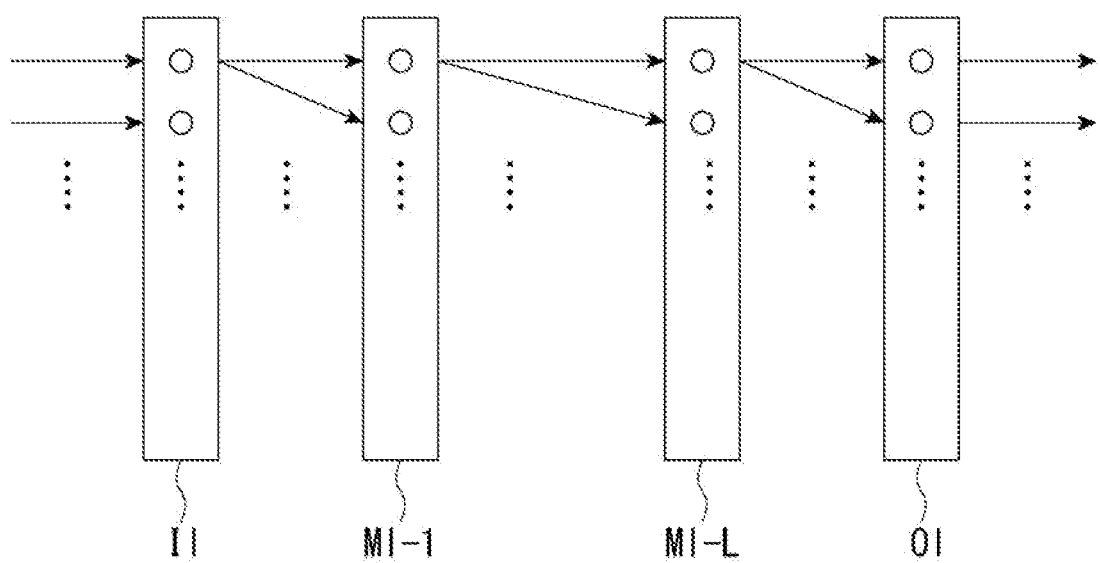
FIG. 3 is an explanatory diagram showing an example of a machine learning model according to the first example embodiment.

FIG. 3 shows a CNN as an example of the machine learning model according to the present example embodiment. A CNN is a kind of artificial neural network, and comprises one input layer, multiple intermediate layers (hidden layers) and one output layer. The CNN illustrated in FIG. 3 is provided with an input layer Il, L layers (L is an integer equal to or greater than 2) of hidden layers Ml-1 to Ml-L, and an output layer Ol. Each layer has a predetermined number of nodes. The multiple intermediate layers include at least one convolutional layer and one pooling layer.

Each node of the input layer Il outputs an input value input to itself to at least one node of the next layer.

Each node of the output layer Ol externally outputs an input value input from at least one node of the immediately preceding layer.

A number of kernels are preset in the convolution layer. The number of kernels corresponds to the number of kernels used for processing (for example, calculation) for each input value. The number of kernels is typically less than the number of input values. A kernel refers to a processing unit for calculating one output value at a time. Output values calculated in one layer are used as input values to the next layer. Kernels are also called filters. Kernel size refers to the number of input values used for one process in the kernel. The kernel size is typically an integer of 2 or greater.

The convolution layer is a layer that calculates the convolved value by executing a convolution operation for each kernel on the input values input from the immediately preceding layer for each of multiple nodes, and calculates the corrected value by adding the calculated convolved value and the bias value. The convolution layer computes the function value of a predetermined activation function for the computed correction value and outputs the computed output value to the next layer. One or more input values are input to each node of the convolution layer from the immediately preceding layer, and independent convolution coefficients are used for each input value to calculate the convolution value at each node. The convolution coefficients, bias values and activation function parameters become part of the set of model parameters.

As the activation function, for example, a rectified linear unit, a sigmoid function, and the like can be used. A rectified linear unit is a function that sets an output value with respect to an input value that is equal to or lower than a predetermined threshold value (for example, 0) to a threshold value, and directly outputs an input value that exceeds the predetermined threshold value as is. Therefore, this threshold can be part of a set of model parameters. For a convolutional layer, whether or not it is necessary to refer to the input value from the node of the previous layer and whether or not to output the output value to the node of the next layer can be part of a set of model parameters.

A pooling layer is a layer having a node that determines one representative value from the input values respectively input from a plurality of nodes of the immediately preceding layer and outputs the determined representative value to the next layer as an output value. As the representative value, for example, a value that statistically represents a plurality of input values such as maximum value, average value, and mode value is used. A stride is set in advance in the pooling layer. A stride indicates the range of mutually adjacent nodes in the immediately preceding layer in which an input value is referenced for one node. As such, a pooling layer can also be viewed as a layer that down-samples the input values from the previous layer to a lower dimension and provides an output value to the next layer.

(Parameter Learning)

In the machine learning model used by the quantization interval estimation units 128 and 248, model parameters for calculating an output value as an objective variable are preset in the machine learning model when an input value as an explanatory variable is input. In the present application, the parameter set used for the quantization interval model may be called a "quantization interval model parameter", and the parameter set used for the probability distribution model may be called a "probability distribution model parameter".

Therefore, the encoding device 10 may be provided with a parameter learning unit (not shown) for executing model learning processing on training data and acquiring parameter sets for each machine learning model. Training data may also be called supervised data, learning data, or the like. The training data includes a large number of data sets that are pairs of known explanatory variables and known objective variables corresponding to the explanatory variables.

As the training data for acquiring model parameters, the parameter learning unit acquires a plurality of data sets that are pairs of known input values as explanatory variables and known output values corresponding to the input values as objective variables. Then, in the parameter learning, the parameter learning unit can recursively calculate the model parameters of that machine learning model so that the magnitude of loss from the output values included in that data set to the estimated values calculated using a given machine learning model for the input values included in the individual data sets is minimized for the training data as a whole.

As an index value of the magnitude of loss, for example, sum of squared differences (SSD), sum of absolute differences (SAD), cross entropy, or the like can be used. The parameter learning unit can use, for example, gradient descent, stochastic gradient descent, conjugate gradient, error back propagation, and other methods in calculating model parameters. In the present application, minimization includes not only absolute minimization but also the search for model parameters that give a smaller loss. Accordingly, a temporary increase in loss may occur in the minimization procedure.

The quantization interval estimation units 128 and 248 can set the model parameters calculated by the parameter learning unit to their own machine learning models.

Next, training data used for learning the quantization interval model will be described. The parameter learning unit acquires, as input values (explanatory variables), M quantized values $Z_{i-1-M}, \ldots, Z_{i-1}$ up to the last processed quantized value and, as output values (objective variables), a quantization interval vector indicating the quantization interval $Q_i$ defined for the quantized value $Z_i$ to be processed at that time, and constructs a data set that maps the input and output values. The quantization interval vector includes, as an element value for each predetermined quantization interval candidate value, a corresponding flag indicating whether or not the vector corresponds to the quantization interval represented by integer values 1 and 0, respectively. Therefore, among the quantization interval candidate values included in the quantization interval vector, the corresponding flag value corresponding to the value equal to the determined quantization interval is 1, while the corresponding flag value corresponding to the other quantization interval candidate values is 0.

When determining the quantization interval $Q_i$ indicated as the output value, the parameter learning unit calculates a predetermined cost value for each individual quantization interval candidate value for the input element value $z_i$ that gives the quantized value Zi, and defines the quantization interval candidate value that gives the lowest cost value for quantization as the optimal quantization interval $Q_i$ for the quantized value $Z_i$. The cost value is an index value for calculating an index value indicating the quantization cost by combining a first cost component, which indicates a higher cost with more information, and second cost component, which indicates a lower cost with less quantization error. In general, the larger the quantization interval $Q_i$, the smaller the information amount of the quantization value candidate code for indicating the quantized value $Z_i$, but the larger the quantization error. Since the first cost component and the second cost component exhibit a trade-off style change tendency according to changes in the quantization interval $Q_i$, one quantization interval $Q_i$ is determined for a given input element value $z_i$. Therefore, a confidence level for each quantization interval candidate value is expected to be obtained as the output value calculated using the quantization interval model for the M quantized values $Z_{i-1-M}, \ldots, Z_{i-1}$ serving as input values.

As the first cost component, for example, a real value given by a function (for example, proportional) that increases monotonically according to an increase in the amount of information required to represent the quantized value $Z_i$ with the quantization interval $Q_i$ can be applied. The parameter learning unit can determine the multiplication value obtained by multiplying the bit length of the quantization value candidate code predetermined for the quantization interval Qi by a predetermined first weighting factor as the first cost component. When the quantization interval $Q_i$ is a scalar value, the parameter learning unit can calculate, as the bit length of the quantization value candidate code, the value $\log_2[\text{ceil}(\zeta_i)]$ obtained by rounding up to an integer value the logarithmic value obtained by dividing the quantized value $Z_i$ by the value range width $W_i$. ceil(•) denotes a ceiling function for a real value "•".

As the second cost component, for example, a real value that quantitatively indicates the magnitude of the quantization error can be applied. The parameter learning unit can for example determine a multiplication value obtained by multiplying the absolute value of the quantization error, which is the difference between the input element value $z_i$ and the quantized value $Z_i$, by a predetermined second weighting factor, as the second cost component. When the input element value and the quantized value are each vectors, SSD, SAD, cross entropy, and the like can be applied instead of the absolute value.

In the present application, optimization includes determining the most appropriate quantization value candidate as well as searching for a quantization value candidate that gives a lower cost value. Therefore, in the optimization procedure, the cost value may increase, or a quantization value candidate that gives a higher cost value may be determined.

Next, training data used for learning the probability distribution model will be described. The parameter learning unit uses, as input values (explanatory variables), M quantized values $Z_{i-1-M}, Z_{i-1}$ up to the last processed quantized value and, as output (objective variables), the probability distribution of the quantization value candidates for the quantized value $Z_i$ to be processed, and constructs a data set that maps the input and output values. The probability distribution of quantization value candidates corresponds to the occurrence frequency of individual quantization value candidates. Also, a plurality of quantization value candidates exist for one quantization value candidate. Therefore, the parameter learning unit can determine the probability distribution of quantization value candidates by counting the occurrence frequency of each quantization value candidate for each quantization interval $Q_i$, and normalizing the calculated occurrence frequency by the sum of the occurrence frequencies. When counting the occurrence frequency of the quantization value candidates, the parameter learning unit increments by one the occurrence frequency of the quantization value candidate equal to the quantized value $Z_i$ determined for the input element value $z_i$, among the quantization value candidates for the quantization interval $Q_i$ determined for each input element value $z_i$, and maintains the occurrence frequencies of the other quantization value candidates. Therefore, it is expected that the occurrence probability for each quantization value candidate, i.e., the probability distribution of the quantization value candidates, can be obtained as an output value calculated using the probability distribution model for M quantized values $Z_{i-1-M}, \ldots, Z_{i-1}$ serving as input values.

(Encoding Process)

Figure 6:
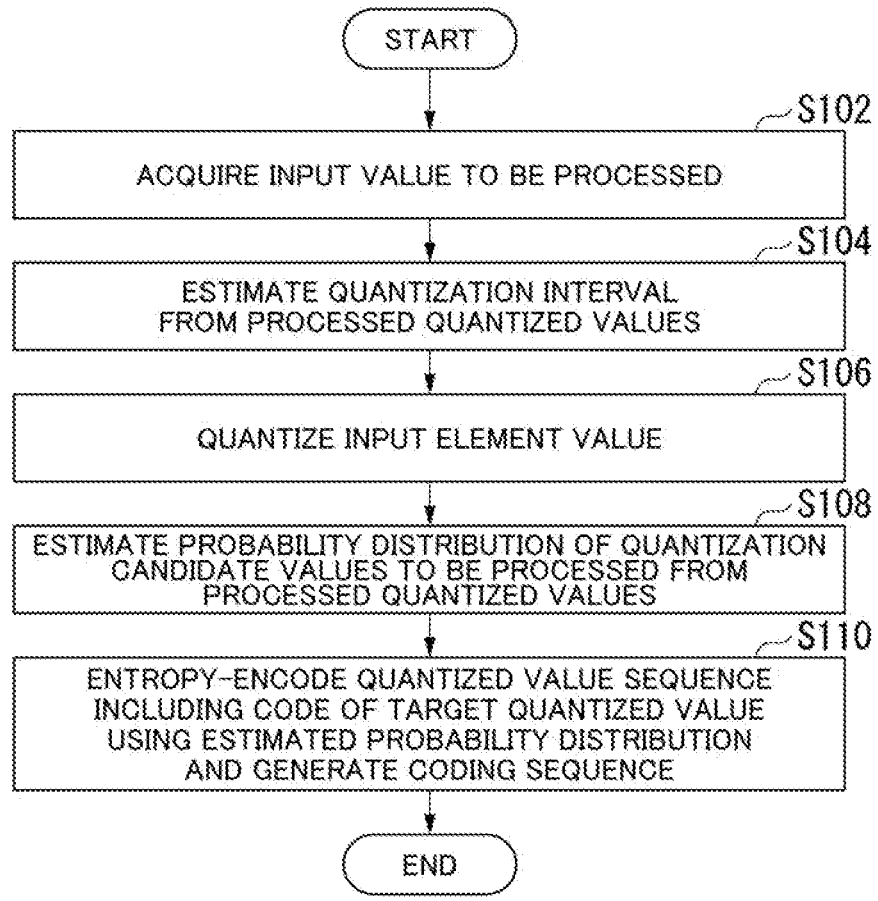
FIG. 6 is a flowchart illustrating an example of the encoding process according to the first example embodiment.

Next, the encoding process according to the present example embodiment will be described. FIG. 6 is a flowchart showing an example of the encoding process according to the present example embodiment.

(Step S102) The input unit 122 acquires an input value to be processed and outputs it to the quantization unit 124.

(Step S104) The quantization interval estimation unit 128 determines the quantization interval of the quantized value to be processed using the quantization interval model for the N processed quantized values up to that point. The quantization interval estimation unit 128 outputs the determined quantization interval to the quantization unit 124.

(Step S106) The quantization unit 124 quantizes the input element value included in the obtained input value using the quantization interval estimated by the quantization interval estimation unit 128. The quantization unit 124 stores the quantized value obtained by quantization in the quantized value storage unit 126.

(Step S108) The quantization interval estimation unit 128 uses the probability distribution model for the N processed quantized values up to that point to estimate the probability distribution of quantization value candidates for the quantized values to be processed at that point. The quantization interval estimation unit 128 outputs the estimated probability distribution to the entropy encoding unit 130.

(Step S110) The entropy encoding unit 130, for each entropy encoding unit, uses the occurrence probability estimated for each quantized value to entropy-encode quantization sequence containing the quantized codes representing the individual quantized values calculated by the quantization unit 124. The entropy encoding unit 130 outputs a coding sequence generated by executing the entropy encoding. Subsequently, the processing shown in FIG. 6 ends.

(Decoding Process)

Figure 7:
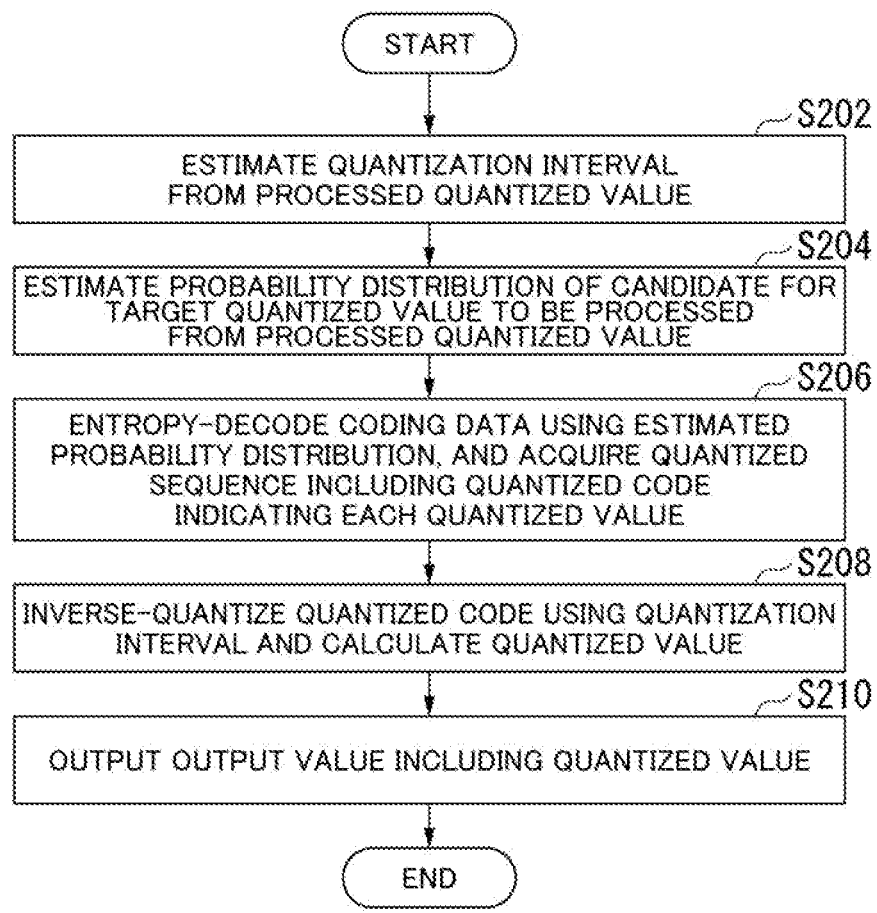
FIG. 7 is a flowchart illustrating an example of the decoding process according to the first example embodiment.

Next, the decoding process related to the present example embodiment will be described. FIG. 7 is a flowchart showing an example of the decoding processing according to the present example embodiment.

(Step S202) The quantization interval estimation unit 248 determines the quantization interval of the quantized value to be processed using the quantization interval model for the N processed quantized values up to that point. The quantization interval estimation unit 248 outputs the determined quantization interval to the inverse quantization unit 244.

(Step S204) The quantization interval estimation unit 248 uses the probability distribution model for the N processed quantized values up to that point to estimate the probability distribution of quantization value candidates for the quantized values to be processed at that point. The quantization interval estimation unit 128 outputs the estimated probability distribution to the entropy decoding unit 242.

(Step S206) The entropy decoding unit 242 receives a coding sequence for each entropy decoding unit. The entropy decoding unit 242 entropy-decodes the input quantization sequence using the estimated occurrence probability for each quantized value. The entropy decoding unit 242 outputs to the inverse quantization unit 244 the quantized code included in the quantization sequence generated by entropy decoding.

(Step S208) The inverse quantization unit 244 calculates the quantized value by inverse quantization using the quantization interval input from the quantization interval estimation unit 248, for the quantized code input from the entropy decoding unit 242. The inverse quantization unit 244 stores the quantized value obtained by inverse quantization in the quantized value storage unit 246. The inverse quantization unit 244 outputs to the output unit 250 a quantized value based on the quantized code included in the quantization sequence determined by the entropy decoding unit 242.

(Step S210) The output unit 250 outputs an output value including the quantized value input from the inverse quantization unit 244 as an output element value.

Subsequently, the processing shown in FIG. 7 ends.

Second Example Embodiment

Figure 8:
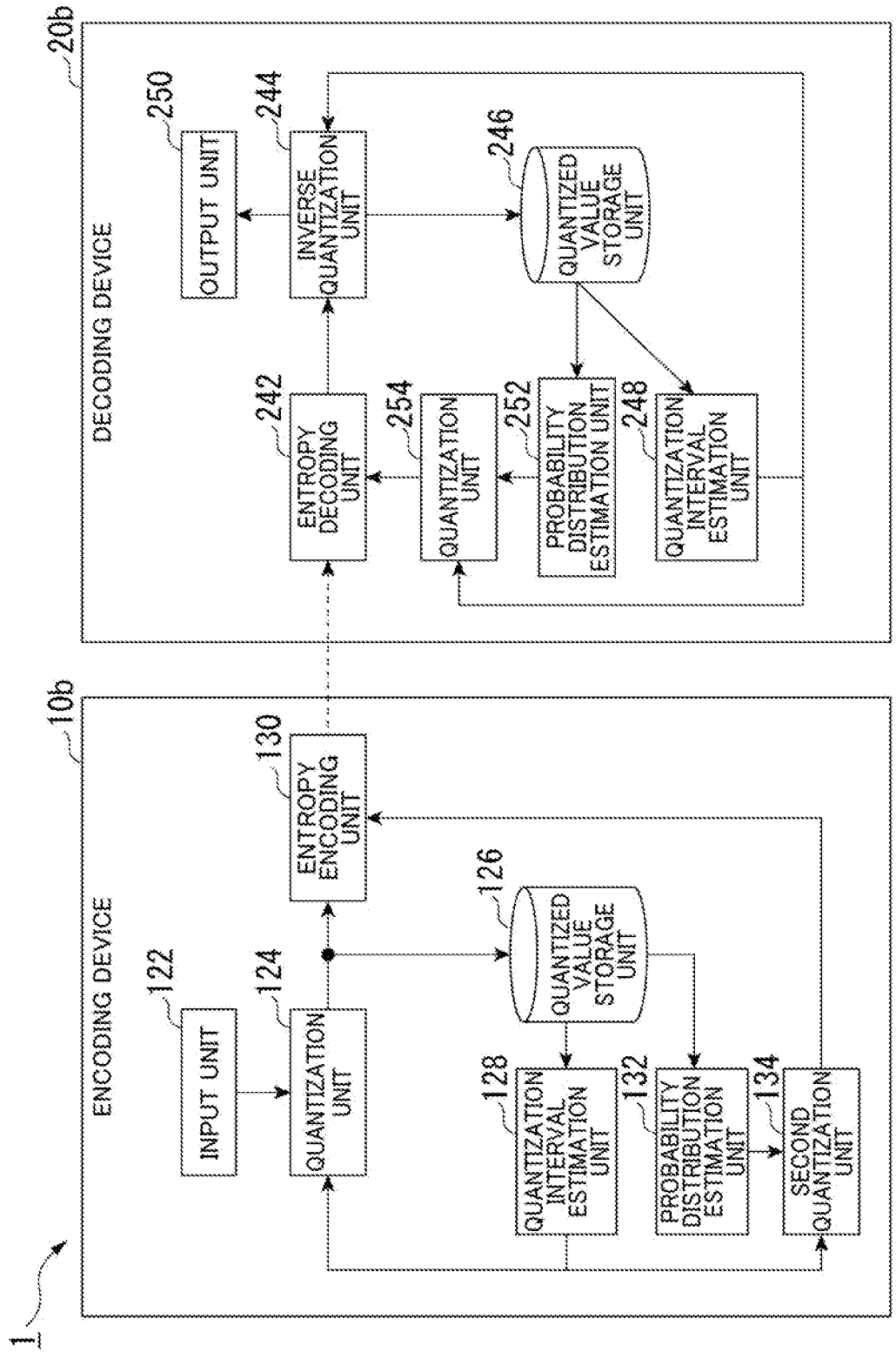
FIG. 8 is a schematic block diagram showing a configuration example of a data processing system according to the second example embodiment.

Next, a second example embodiment will be described. The following description mainly focuses on differences with the first example embodiment. Configurations and processes common to those of the first example embodiment are denoted by common reference numerals, and their descriptions are incorporated. FIG. 8 is a schematic block diagram showing a configuration example of the data processing system 1 according to the second example embodiment. The data processing system 1 is constituted by an encoding device 10b and a decoding device 20b.

In addition to the input unit 122, the quantization unit 124, the quantized value storage unit 126, the quantization interval estimation unit 128, and the entropy encoding unit 130, the encoding device 10b is provided with a probability distribution estimation unit 132 and a second quantization unit 134.

The probability distribution estimation unit 132 uses a predetermined probability distribution estimation model to determine the continuous probability distribution of quantization value candidates for the input element values to be processed based on the quantized values of the processed input element values stored in the quantized value storage unit 126.

The probability distribution estimation unit 132 determines parameters of a predetermined distribution function (hereinbelow referred to as "distribution function parameters") that indicate the characteristics of the continuous probability distribution. As the predetermined distribution function, for example, a normal distribution (including a multi-dimensional normal distribution of two or more dimensions), a Poisson distribution, a Laplace distribution, or a weighted sum of these can be applied. If the given distribution function is a weighted sum of multiple normal distributions, the distribution function parameters are weight, mean and variance for each normal distribution. If the given distribution function is a weighted sum of Poisson distributions, the distribution function parameters are the weighting factor, base, rate and number of occurrences for each Poisson distribution. If the given distribution function is a weighted sum of Laplacian distributions, the distribution function parameters are the weighting factor, scale and location for the individual Laplacian distributions. The probability distribution estimation unit 132 calculates the distribution function parameters using a probability distribution estimation model for the processed M quantized values $Z_{i-1-M}, \ldots, Z_{i-1}$. The probability distribution estimation unit 132 outputs the calculated distribution function parameters to the second quantization unit 134.

The training data used by the probability distribution estimation unit 132 for learning the probability distribution model parameters includes a number of data sets that map the input values to the output values by taking as input values the M quantized values $Z_{i-1-M}, \ldots, Z_{i-1}$ up to the last processed quantized value and adopting as output values the distribution function parameters representing the probability distribution $P(Z_i|Z_{i-1-N}, \ldots, Z_{i-1})$ of the quantization value candidates for the quantized value $Z_i$ to be processed. The model learning unit may predetermine the distribution function parameters by executing a known regression analysis on the distribution function $P(Z_i|Z_{i-1-N}, \ldots, Z_{i-1})$ counted by the above method, assuming a given distribution function.

The quantization interval $Q_i$ is input to the second quantization unit 134 from the quantization interval estimation unit 128, and the distribution function parameters are input from the second quantization unit 134. The second quantization unit 134 quantizes the continuous probability distribution $p(\{z_i\}|Z_{i-1-N}, \ldots, Z_{i-1})$ indicated by the distribution function parameter using the quantization interval input from the quantization interval estimation unit 128 and generates the probability distribution $P(Z_i|Z_{i-1-N}, \ldots, Z_{i-1})$ of quantized value candidates, which is a discrete probability distribution. The probability distribution $P(Z_i|Z_{i-1-N}, \ldots, Z_{i-1})$ indicates the occurrence probability for each quantization value candidate determined by the quantization interval. More specifically, the second quantization unit 134 integrates the continuous probability distribution $p(\{z_i\}|Z_{i-1-N}, \ldots, Z_{i-1})$ for each value range of input element values that gives a quantized candidate determined using the quantization interval, and calculates the occurrence probability of that quantization value candidate. The second quantization unit 134 outputs the generated probability distribution $P(Z_i|Z_{i-1-N}, \ldots, Z_{i-1})$ to the entropy encoding unit 130.

The second quantization unit 134 may use the Cumulative Distribution Function (CDF) for the continuous probability distribution in the integral calculation of the one-dimensional continuous probability distribution. CDF is an integral form of a continuous probability distribution. The integrated value within the value range of the continuous probability distribution is the difference value obtained by subtracting the CDF function value for the lower limit of the range from the CDF function value for the upper limit of the range.

The entropy encoding unit 130 executes the entropy encoding process on the quantization sequence using the probability distribution $P(Z_i|Z_{i-1-N}, \ldots, Z_{i-1})$ as in the first example embodiment. In the quantization interval estimation unit 128, the configuration related to the estimation of the probability distribution $P(Z_i|Z_{i-1-N}, \ldots, Z_{i-1})$ may be omitted. Therefore, the probability distribution model need not be set up in the quantization interval estimation unit 128.

A decoding device 20b includes not only the entropy decoding unit 242, the inverse quantization unit 244, the quantized value storage unit 246, the quantization interval estimation unit 248, and the output unit 250, but also a probability distribution estimation unit 252 and a quantization unit 254.

Like the probability distribution estimation unit 132, the probability distribution estimation unit 252 uses the probability distribution estimation model to determine the continuous probability distribution of quantization value candidates for the quantized value to be processed based on the processed quantized values stored in the quantized value storage unit 246. Continuous probability distributions are represented using probability distribution parameters. The probability distribution estimation unit 252 outputs the determined probability distribution parameters to the quantization unit 254.

The quantization interval $Q_i$ is input from the quantization interval estimation unit 248 to the quantization unit 254, and the distribution function parameter is input from the quantization unit 254. The quantization unit 254 uses the same method as the second quantization unit 134 to quantize the continuous probability distribution $p(\{z_i\}|Z_{i-1-N}, \ldots Z_{i-1})$ indicated by the distribution function parameters using the quantization interval input from the quantization interval estimation unit 248 and generates the probability distribution $P(Z_i|Z_{i-1-N}, \ldots, Z_{i-1})$ of quantized value candidates, which is a discrete probability distribution. The quantization unit 254 outputs the generated probability distribution $P(Z_i|Z_{i-1-N}, \ldots, Z_{i-1})$ to the entropy decoding unit 242.

The entropy decoding unit 242 executes the entropy encoding process on the quantization sequence using the probability distribution $P(Z_i|Z_{i-1-N}, \ldots, Z_{i-1})$ as in the first example embodiment. The quantization interval estimation unit 248 may omit the processing and configuration related to the estimation of the probability distribution $P(Z_i|Z_{i-1-N}, \ldots, Z_{i-1})$. Accordingly, the probability distribution model need not be set up in the quantization interval estimation unit 248 as well.

The quantization value candidates that constitute the probability distribution output from the second quantization unit 134 or the quantization unit 254 may be represented using its quantization value candidate code.

Figure 9:
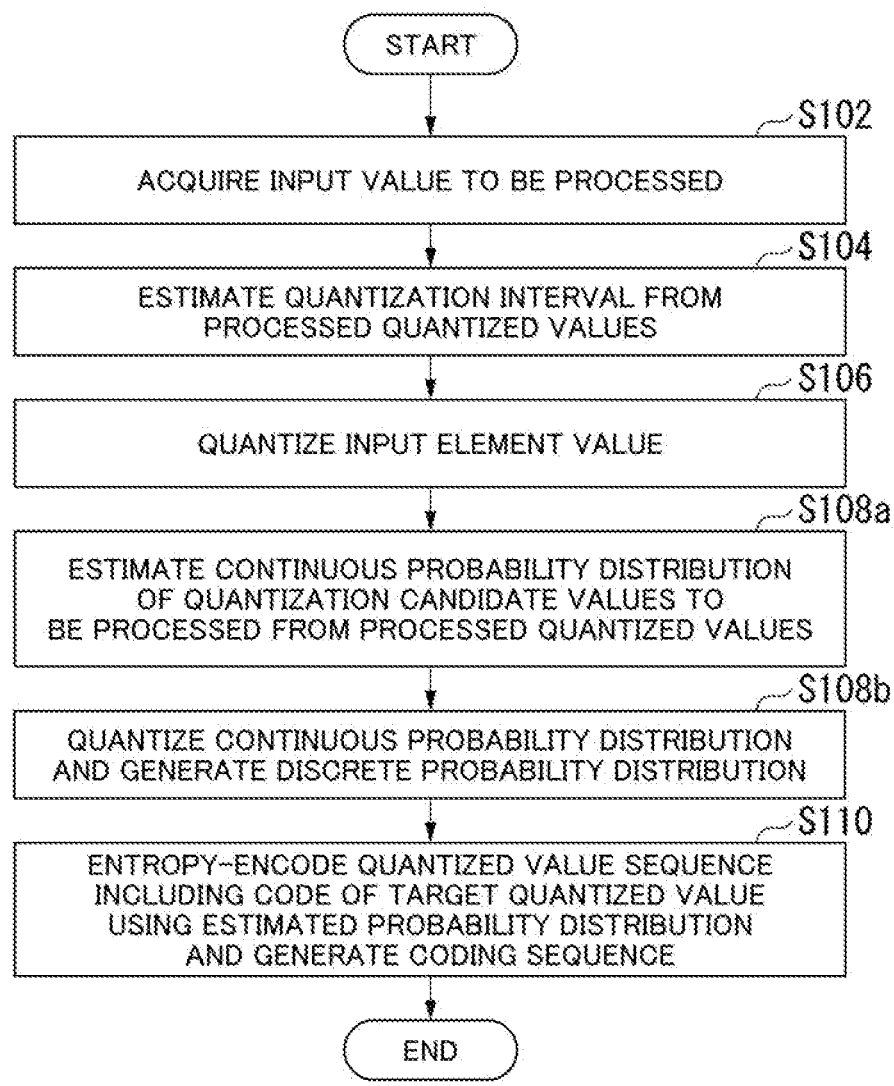
FIG. 9 is a flowchart illustrating an example of the encoding process according to the second example embodiment.

Next, the encoding process according to the present example embodiment will be described. FIG. 9 is a flowchart showing an example of the encoding process according to the present example embodiment.

The encoding process according to the present example embodiment includes steps S102, S104, S106, S108a, S108b, and Step S110.

In the present example embodiment, after the process of Step S106 is completed, the process proceeds to Step S108a.

(Step S108a) The probability distribution estimation unit 132 uses a predetermined probability distribution estimation model to determine the continuous probability distribution of quantization value candidates for the input element values to be processed based on the quantized values of processed input element values.

(Step S108b) The second quantization unit 134 quantizes the continuous probability distribution determined by the probability distribution estimation unit 132 using the quantization interval determined by the quantization interval estimation unit 128, and generates a probability distribution of quantized value candidates, which is a discrete probability distribution. Subsequently, the processing proceeds to Step S110.

Figure 10:
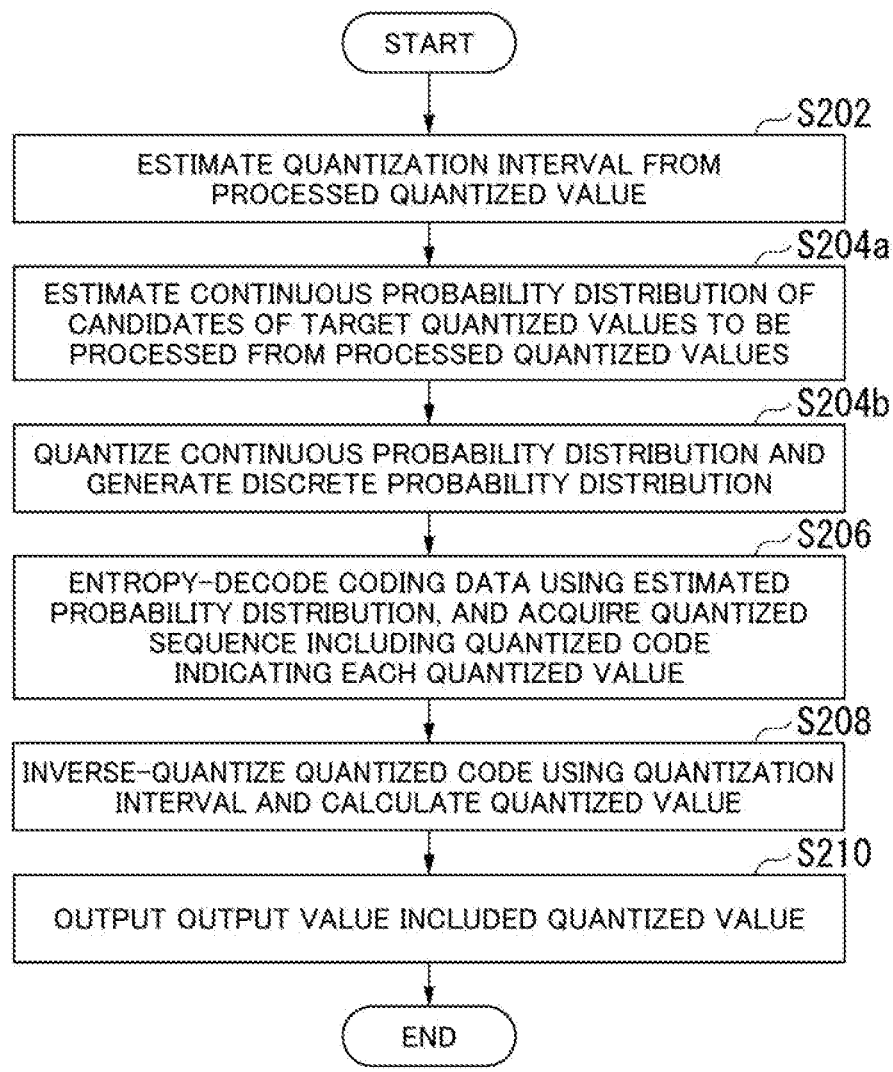
FIG. 10 is a flowchart illustrating an example of the decoding process according to the second example embodiment.

Next, the encoding processing according to the present example embodiment will be described. FIG. 10 is a flowchart showing an example of the decoding processing according to the present example embodiment.

The encoding processing according to the present example embodiment includes steps S202, S204a, S204b, S206, S208, and Step S210.

In the present example embodiment, after the processing of Step S202 is completed, the processing proceeds to Step S204a.

(Step S204a) The probability distribution estimation unit 252 determines a continuous probability distribution of quantization value candidates for the quantized value to be processed based on processed quantized values, using a predetermined probability distribution estimation model.

(Step S204b) The quantization unit 254 quantizes the continuous probability distribution determined by the probability distribution estimation unit 252 using the quantization interval determined by the quantization interval estimation unit 248, and generates a probability distribution of quantized value candidates, which is a discrete probability distribution. Subsequently, the processing proceeds to Step S206.

Information to be processed according to each of the above example embodiments (hereinafter referred to as "processing object information") is not limited to a specific type of information. More specifically, the processing object information corresponds to the information indicated by the input value input to the encoding device 10b, the quantized value quantized in the encoding device 10b, or the quantized value decoded in the decoding device 20b. The processing object information should be information that can be expressed as a quantized value successively acquired in a spatial or temporal manner and obtained by quantizing. The processing object information may be, for example, a signal value for each pixel representing an image, a predictive coding residual in a block forming a part of the image, or the conversion coefficient thereof into the frequency domain. The processing object information may be predictive coefficients indicating frequency characteristics for each predetermined section, a fundamental frequency, gain for each harmonic component, and the like. The processing object information may be point cloud data. Point cloud data is data that indicates the state of the surface of an object in a three-dimensional space. The point cloud data is data indicating the coordinates in a three-dimensional space for each of a plurality of sample points and the state (for example, color, brightness, temperature, pressure, and the like) of those coordinates.

An input value serving as the processing object information may be input to the encoding device $10b$, which may be provided with a feature analysis unit (not shown) for executing predetermined arithmetic operations to determine the processing object information from the input data to the device. Arithmetic processing of the feature analysis unit may be a dedicated step for determining the processing object information from input data, may be part of the steps that make up a known encoding process, or may be a step in some other process (e.g., image recognition, speech recognition, surveillance, etc.) where encoding is not the primary objective.

For example, image data showing signal values per pixel or point cloud data showing signal values per coordinate are input as input data, and the feature analysis unit generates feature quantities including individual element values calculated using a predetermined mathematical model with the signal value per pixel as explanatory variables as processing object information. If the predetermined mathematical model is a neural network, the feature analysis unit may provide the output value obtained as the objective variable as the processing object information, or may provide a calculated value obtained in any of the intermediate layers as the processing object information.

The decoding device $20b$ may output the quantized value to be processed obtained by the decoding process, or may be provided with an information restoration unit (not shown) to generate output data restored from the obtained quantized values by a predetermined inverse operation. Arithmetic processing by the information reconstruction unit (not shown) may be a dedicated step for generating output data from processing object data, may be part of the steps that make up a known decoding process, or may be a step in some other process (e.g., image recognition, speech recognition, surveillance, etc.) where decoding is not the primary objective.

For example, the information reconstruction unit calculates a signal value for each pixel using a predetermined mathematical model including a feature quantity that is a quantized value to be restored as the processing object information as an explanatory variable, and reconstructs image data indicating the calculated signal value. If the predetermined mathematical model is a neural network, the information reconstruction unit may process the processing object information as an input value obtained as an explanatory variable, or the processing object information may be supplied instead of the calculated values obtained in a predetermined intermediate layer assuming that input values are entered as explanatory variables. The predetermined intermediate layer may be a layer associated with the intermediate layer for which the feature analysis unit has provided the feature quantity.

The processing object information may be indicated by a scalar, a vector, or a high-dimensional variable value in which each sample is indicated by a vector of two or more dimensions. The processing object information to be provided may be, for example, a feature quantity in which each sample includes element values specified by x row, y column, and c channel. When a neural network is used as a mathematical model, each sample is an output value or calculated value from one node constituting each layer, or an input value or calculated value to the one node, and the above corresponds to index i.

In the above description, the quantization interval model and the probability distribution model are mainly mathematical models, but the present invention is not limited thereto.

The quantization interval model may be a data table that shows for every M quantized values $Z_{i-1-M}, \ldots, Z_{i-1}$ as input values, the quantization interval $Q_i$ obtained for the input values as an output value. The quantization interval estimation units 128 and 248 can determine the quantization interval $Q_i$ corresponding to the processed M quantized values $Z_{i-1-M}, \ldots, Z_{i-1}$ by referring to the relevant data table set in each respective unit.

The probability distribution model may be a data table that associatively shows, for each of the M quantized values $Z_{i-1-M}, \ldots, Z_{i-1}$ serving as an input value, the probability distribution (or the distribution function parameters of said probability distribution) of the quantization value candidate obtained for the input value as an output value. The quantization interval estimation units 128 and 248 or probability distribution estimation units 132 and 252, by referring to the data table set therein, can determine the probability distribution (or the distribution function parameters of said probability distribution) of the quantization value candidate corresponding to the processed M quantized values $Z_{i-1-M}, \ldots, Z_{i-1}$.

The processed quantized values $Z_{i-1-M}, \ldots, Z_{i-1}$ that the quantization interval estimation units 128 and 248 refer to when determining the quantization interval $Q_i$ for the quantized value $Z_i$ do not necessarily include the quantized values of samples spatially or temporally adjacent to the quantized value $Z_i$, and only quantized values of samples spatially or temporally separated from the quantized value Zi may be included (e.g., samples of the same phase in adjacent frames, adjacent blocks, or adjacent slices). The same phase means equal relative order or position in a processing unit such as a frame, block, or slice.

The processed quantized values $Z_{i-1-M}, \ldots, Z_{i-1}$ that the quantization interval estimation units 128, 248 or probability distribution estimation units 132, 252 refer to in determining the probability distribution of the quantization value candidates for the quantized value $Z_i$ (or the distribution function parameters of the probability distribution) may also not necessarily include the quantized values of samples spatially or temporally adjacent to the quantized value $Z_i$, and only the quantized values of samples spatially or temporally separated from the quantized value $Z_i$ may be included.

(Minimum Configuration)

Figure 11:
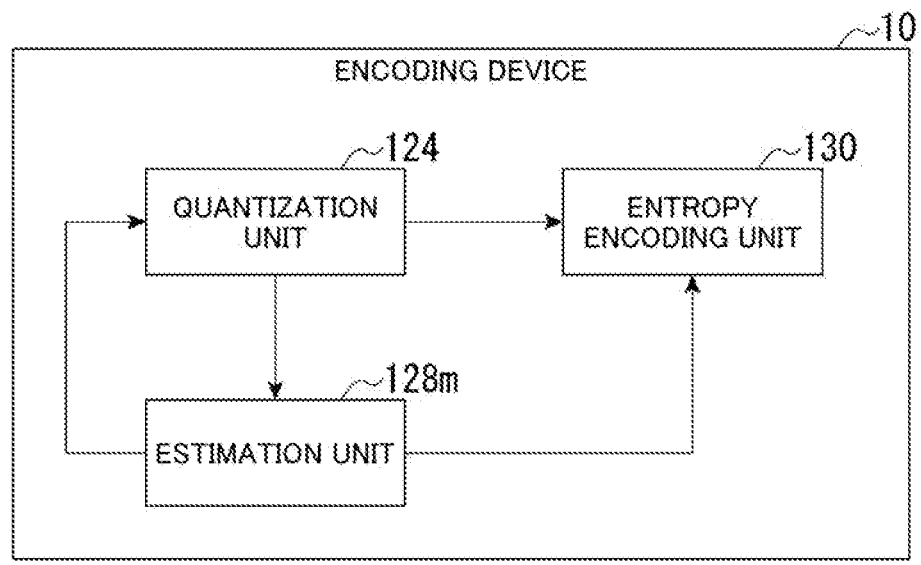
FIG. 11 is a schematic block diagram illustrating the minimum configuration of an encoding device.
Figure 12:
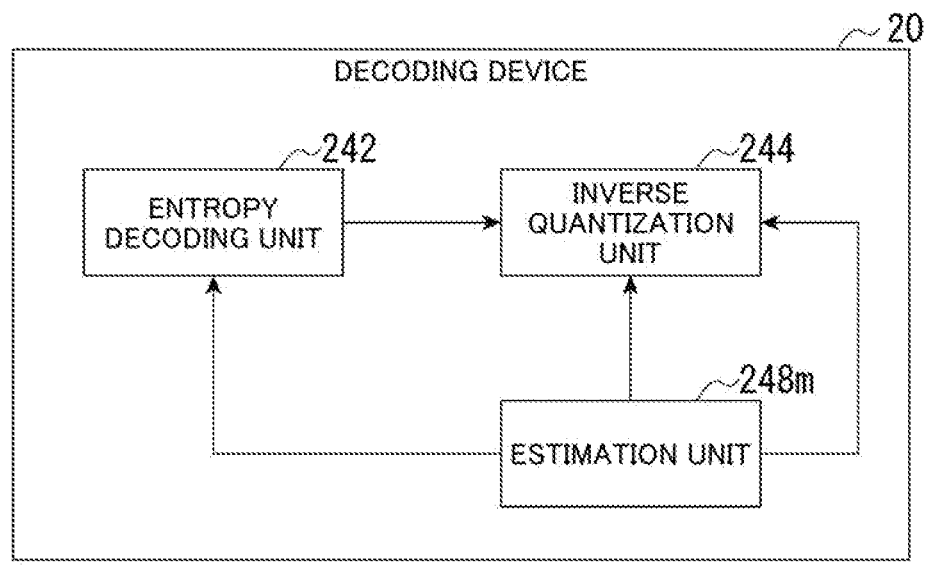
FIG. 12 is a schematic block diagram illustrating the minimum configuration of a decoding device.

Next, the minimum configuration of the above example embodiments will be described. FIG. 11 is a schematic block diagram illustrating the minimum configuration of the encoding device 10. FIG. 12 is a schematic block diagram illustrating the minimum configuration of the decoding device 20.

As shown in FIG. 11, the encoding device 10 is provided with an estimation unit 128*m*, the quantization unit 124, and the entropy encoding unit 130. The estimation unit 128*m* determines, on the basis of processed quantized values, a quantization interval for quantizing input element values, which are elements of input values to be processed, and determines, on the basis of the processed quantized values, a probability distribution of quantization value candidates, which are candidates of quantized values for the input element values to be processed. The quantization unit 124 quantizes the input element value using the quantization interval determined by the estimation unit 128*m* to determine the quantized value. The entropy encoding unit 130 uses the probability distribution determined by the estimation unit 128*m* to entropy code the quantization sequence containing the quantized value code indicating the quantized value of the input element value.

As shown in FIG. 12, the decoding device 20 is provided with an estimation unit 248*m*, the entropy decoding unit 242, and the inverse quantization unit 244. The estimation unit 248*m* determines, on basis of the processed quantized values, a quantization interval for determining a quantized value by inversely quantizing a quantized value code to be processed, and determines, on the basis of the processed quantized values, a probability distribution of quantization value candidates, which are candidates of quantized values. The entropy decoding unit 242 entropy-decodes the coding sequence using the probability distribution determined by the estimation unit 248*m* to generate a quantized value sequence including the quantized value code to be processed. The inverse quantization unit 244 de-quantizes the quantized value code included in the quantized value sequence to determine the quantized value.

According to the encoding device 10, the quantization interval for the input element value to be processed and the probability distribution of the quantization value candidates are determined based on the processed quantized values. In entropy encoding, a quantized value code for representing a quantized value can be determined based on the probability distribution of the quantization value candidates.

According to the decoding device 20, the quantization interval for the quantized value code to be processed and the probability distribution of the quantization value candidates are determined based on the processed quantized values. In entropy-decoding, a quantized value code for representing a quantized value can be determined based on the probability distribution of the quantization value candidates.

Therefore, even if the information on the quantization interval is not provided from the encoding device 10, the decoding device 20 can reconstitute the quantization interval used in the quantization by the encoding device 10, and thus the quantized value, from the coding sequence obtained by the encoding. Also, in entropy-encoding and entropy-decoding, a quantization code indicating quantization value candidates including the quantized value to be processed can be determined based on a probability distribution determined from processed quantized values. Therefore, it is possible to reduce the amount of information related to the expression of quantized values.

The estimation unit 128*m* may be implemented in different forms, such as the quantization interval estimation unit 128 (FIG. 1), or the quantization interval estimation unit 128 and probability distribution estimation unit 132 (FIG. 8).

For example, the estimation unit 128*m* may determine the quantization interval from the processed quantized value determined by the quantization unit 124 by using a mathematical model in which the processed quantized value is set as the explanatory variable and the quantization interval for quantizing the input element values is set as the objective variable. With this configuration, the quantization interval for the input element value to be processed is determined from the processed quantized value.

In addition, the estimation unit 248*m* may determine the quantization interval from the processed quantized value determined by the inverse quantization unit 244 by using a mathematical model in which the processed quantized value is set as the explanatory variable and the quantization interval for inverse quantizing the quantized value code to be processed is set as the objective variable.

As a result, the quantization interval for the processing object is predicted from a processed quantized value. Therefore, when quantizing the input element value to be processed or inversely quantizing a quantized value code, a quantization interval corresponding to the processing object is obtained. Therefore, delays in quantization or inverse quantization can be suppressed.

The estimation unit 128*m* may determine the distribution function parameter of the probability distribution function from the processed quantized values determined by the quantization unit 124 using a mathematical model in which the processed quantized values are set as explanatory variables and the quantization interval for quantizing the distribution function parameter, which is a parameter of the probability distribution function indicating the occurrence probability of the quantization value candidates, which are candidates for quantized values to be processed, is the objective variable. Further, the encoding device 10 may include a second quantization unit 134 (FIG. 8) that determines the probability distribution of quantization value candidates by discretizing the probability distribution function for each quantization value candidate based on the quantization interval.

The estimation unit 248*m* may determine the distribution function parameter of a probability distribution function from processed quantized values determined by the inverse quantization unit 244 using a mathematical model in which the processed quantized values are set as explanatory variables and the quantization interval for quantizing the distribution function parameter, which is a parameter of the probability distribution function indicating the occurrence probability of the quantization value candidates, which are candidates for quantized values to be processed, is the objective variable. The decoding device 20 may be provided with a quantization unit 254 (FIG. 8) that discretizes the probability distribution function for each quantization value candidate based on the quantization interval to determine the probability distribution of the quantization value candidates.

Thereby, the occurrence probability of quantization value candidates is expressed by a smaller number of distribution function parameters as a whole. Therefore, it is possible to reduce the amount of computation involved in calculating the occurrence probability of quantization value candidates.

Also, the quantization interval may be a vector containing N (N is a predetermined integer equal to or greater than 2) section-specific quantization intervals for each section. The section is a range obtained by dividing the value range of the input element value into N pieces. Since the section-specific quantization interval can differ for each section, quantized values with different accuracies can be obtained for each section.

The encoding device 10 may be provided with a feature analysis unit that determines the element value of a feature quantity from a signal value as an input element value, using a mathematical model that sets the signal value for each pixel constituting the image as an explanatory variable and a feature quantity including multiple element values as an objective variable.

The decoding device 20 may be provided with an information restoration unit that determines the signal value for each pixel from the element values included in a feature quantity using a mathematical model that sets a feature including multiple element values as an objective variable and a signal value for each pixel comprising the image as an explanatory variable.

With this configuration, it is possible to encode feature quantities obtained from image data indicating the signal value of each pixel. Further, it is possible to reconstitute image data indicating a signal value for each pixel from the decoded feature quantities.

The entropy encoding unit 130, based on the probability distribution of the quantization value candidate for each quantized value of an input element value in a predetermined coding unit, may also determine the occurrence probability of each quantization value candidate code, which is a code indicating the quantization value candidate in the coding unit. The entropy encoding unit 130 may determine a codeword corresponding to the quantization value candidate code based on the occurrence probability, and generate a coding sequence including the codeword corresponding to the quantized value.

The entropy decoding unit 242, based on the probability distribution of the quantization value candidate for each quantized value indicated by the quantized value code in a predetermined decoding unit, may also determine the occurrence probability of each quantization value candidate code, which is a code indicating the quantization value candidate in the decoding unit. The entropy decoding unit 242 may determine the codeword corresponding to the quantization value candidate code based on the determined occurrence probability, and determine the corresponding quantized value code for each codeword constituting the coding sequence.

With this configuration, a codeword is determined according to the occurrence probability of each quantization value candidate code for each encoding unit or decoding unit, and a quantized value equivalent to the quantization value candidate corresponding to the determined codeword is expressed. Therefore, it is possible to reduce the information amount of the entire coding sequence for each encoding unit or decoding unit.

Note that the encoding device 10 and the decoding device 20 may each include a computer system therein. For example, the processor described above can be a component of the computer system. Each process described above is stored in a computer-readable storage medium in the form of a program, which is read and executed by a computer to execute these processes. The "computer system" referred to here includes software such as an operating system, device drivers and utility programs, and hardware such as peripheral devices. In addition, the computer-readable recording medium refers to portable media such as magnetic discs, optical discs, ROM (Read Only Memory), semiconductor memory, and storage devices such as hard disks built into computer systems. Furthermore, a computer-readable recording medium may include one that dynamically stores a program for a short period of time, such as a communication line used for transmitting a program over a network such as the Internet or a communication line such as a telephone line, or one that holds a program for a certain period of time, such as a volatile memory inside a computer system serving as a server or a client. Further, the above program may be one for realizing some of the above-described functions, or may be a so-called differential file (differential program) capable of realizing the above-described functions in combination with a program previously recorded in a computer system.

Also, part or all of the encoding device 10 and the decoding device 20 in the above-described example embodiments may be implemented as an integrated circuit such as LSI (Large Scale Integration). Each functional block of the encoding device 10 and the decoding device 20 may be individually processorized, or some or all of them may be integrated with one another and processorized. Also, the method of circuit integration is not limited to LSI, but may be realized by a dedicated circuit or a general-purpose processor. In addition, in the case that an integrated circuit technology emerges as an alternative to LSI due to advances in semiconductor technology, an integrated circuit based on this technology may be used.

Although preferred example embodiments of the present invention have been described above, the present invention is not limited to these example embodiments and modifications thereof. Configuration additions, omissions, substitutions, and other changes are possible without departing from the gist of the present invention.

Moreover, the present invention is not limited by the foregoing description, but only by the appended claims.

INDUSTRIAL APPLICABILITY

According to the encoding device, decoding device, encoding method, decoding method, and program of each of the above aspects, the quantization interval for the input element value to be processed and the probability distribution of the quantization value candidates are determined based on processed quantized values. In entropy-decoding and entropy-decoding, a quantized value code for representing a quantized value can be determined based on the probability distribution of the quantization value candidates. Therefore, even if the information on the quantization interval is not provided from the encoding device, the decoding device can reconstitute the quantization interval used in the quantization in the encoding device, and thus the quantized value. Therefore, it is possible to reduce the amount of information related to the expression of quantized values.

DESCRIPTION OF REFERENCE SIGNS

1 Data processing system
10 Encoding device
20 Decoding device
102 Processor
104 Storage medium
106 Drive unit
108 Input/output unit
112 ROM
114 RAM
122 Input unit
124 Quantization unit
126 Quantized value storage unit
128 Quantization interval estimation unit
128m Estimation unit
130 Entropy encoding unit
132 Probability distribution estimation unit
134 Second quantization unit
242 Entropy decoding unit
244 Inverse quantization unit
246 Quantized value storage unit
248 Quantization interval estimation unit
248m Estimation unit
250 Output unit
252 Probability distribution estimation unit
254 Quantization unit

What is claimed is:

1. An encoding device comprising:
a memory storing instructions; and
a processor configured to execute the instructions to:
calculate a conditional probability distribution for each of a plurality of quantization interval candidate values on the basis of processed quantization values;
determine the quantization interval candidate value that gives a highest occurrence probability to be a quantization interval for quantizing input element values;
determine, on the basis of the processed quantized values, a probability distribution of quantization value candidates, which are candidates of quantized values for the input element values;
use the quantization interval to quantize the input element values and determine a quantized value; and
use the probability distribution to perform entropy encoding of a quantization sequence that includes a quantized value code indicating the quantized values of the input element values.

2. The encoding device according to claim 1, wherein the processor is configured to execute the instructions to perform estimating that includes, using a quantization interval model in which a processed quantized value is set as an explanatory variable and a quantization interval for quantizing input element values is set as an objective variable, determining the quantization interval from the processed quantized value,
wherein the quantization interval model includes at least one of a recurrent neural network, convolutional neural network, a random forest, and a support vector machine.

3. The encoding device according to claim 1, wherein the processor is configured to execute the instructions to perform estimating that includes:
determining, using a probability distribution model in which a processed quantized value is set as an explanatory variable and a quantization interval for quantizing a distribution function parameter is set as an objective variable, wherein the distribution function parameter is a parameter of a probability distribution function indicating the occurrence probability of quantization value candidates;
determining a distribution function parameter of the probability distribution function from the processed quantized value; and
discretizing the probability distribution function for each quantization value candidate based on the quantization interval to determine the probability distribution of the quantization value candidates,
wherein the probability distribution model includes at least one of a recurrent neural network, convolutional neural network, a random forest, and a support vector machine.

4. The encoding device according to claim 2, wherein the quantization interval is a vector including N section-specific quantization intervals for each section (N being a predetermined integer equal to or greater than 2), and the section is a range obtained by dividing a value range of the input element value into N pieces.

5. The encoding device according to claim 1, wherein the processor is further configured to execute the instruction to determine, using a mathematical model that sets a signal value for each pixel constituting an image as an explanatory variable and a feature quantity including multiple element values as an objective variable, the element value from the signal value as the input element value,
wherein the mathematical model includes at least one of a recurrent neural network, convolutional neural network, a random forest, and a support vector machine.

6. The encoding device according to claim 1, wherein the entropy encoding, based on the probability distribution of the quantization value candidates for each quantized value of the input element value in a predetermined encoding unit, determines the occurrence probability of each quantization value candidate code, which is a code indicating the quantization value candidate in the encoding unit,
determines a codeword corresponding to the quantization value candidate code based on the occurrence probability, and
generates a coding sequence including the codeword corresponding to the quantized value.

7. A decoding device comprising:
a memory storing instructions; and
a processor configured to execute the instructions to:
calculate a conditional probability distribution for each of a plurality of quantization interval candidate values on the basis of processed quantization values;
determine the quantization interval candidate value that gives a highest occurrence probability to be a quantization interval for determining a quantized value by de-quantizing a quantized value code;
determine, a probability distribution of quantization value candidates, which are candidates of the quantized values, on the basis of the processed quantized values;
use the probability distribution to execute entropy-decode a coding sequence to generate a quantized value sequence that includes the quantized value code; and
de-quantize the quantized value code included in the quantized value sequence to determine the quantized value.

8. The decoding device according to claim 7, wherein the determining includes, using a quantization interval model in which a processed quantized value is set as an explanatory variable and a quantization interval for inverse quantizing the quantized value code to be processed is set as an objective variable, determining the quantization interval from the processed quantized value,
wherein the quantization interval model includes at least one of a recurrent neural network, convolutional neural network, a random forest, and a support vector machine.

9. The decoding device according to claim 7, wherein the determining includes:
using a probability distribution model in which the processed quantized values are set as explanatory variables and the quantization interval for quantizing a distribution function parameter is set as an objective variable, wherein the distribution function parameter is a parameter of the probability distribution function indicating the occurrence probability of the quantization value candidates;
determining the distribution function parameters of the probability distribution function from the processed quantized value; and
discretizing the probability distribution function for each quantization value candidate based on the quantization interval to determine the probability distribution of the quantization value candidates, wherein the probability distribution model includes at least one of a recurrent neural network, convolutional neural network, a random forest, and a support vector machine.

10. The decoding device according to claim 8, wherein the quantization interval is a vector containing N (N being a predetermined integer equal to or greater than 2) section-specific quantization intervals for each section, and the section is a range obtained by dividing a predetermined value range of an input element value to be quantized into N pieces.

11. The decoding device according to claim 7, wherein the processor is further configured to execute the instruction to use a mathematical model that sets a feature quantity including multiple element values as an objective variable and a signal value for each pixel comprising an image as an explanatory variable to determine the signal value for each pixel from the element values,
wherein the mathematical model includes at least one of a recurrent neural network, convolutional neural network, a random forest, and a support vector machine.

12. The decoding device according to claim 7, wherein an entropy decoding, based on the probability distribution of the quantization value candidate for each quantized value indicated by the quantized value code in a predetermined decoding unit, determines the occurrence probability of each quantization value candidate code, which is a code indicating the quantization value candidate in the decoding unit, determines a codeword corresponding to the quantization value candidate code based on the occurrence probability, and determines the quantized value code corresponding to each codeword constituting the coding sequence.

13. An encoding method performed by a computer and comprising:
calculating a conditional probability distribution for each of a plurality of quantization interval candidate values on the basis of processed quantization values;
determining the quantization interval candidate value that gives a highest occurrence probability to be a quantization interval for quantizing input element values;
determining, on the basis of the processed quantized values, a probability distribution of quantization value candidates, which are candidates of quantized values for the input element values;
using the quantization interval to quantize the input element values and determine a quantized value; and
using the probability distribution to perform entropy encoding of a quantization sequence that includes a quantized value code indicating the quantized values of the input element values.

* * * * *